(12) United States Patent
Burkland et al.

(10) Patent No.: US 7,679,420 B1
(45) Date of Patent: Mar. 16, 2010

(54) SLEW RATE CONTROLLED LEVEL SHIFTER WITH REDUCED QUIESCENT CURRENT

(75) Inventors: William A. Burkland, Huxley, IA (US); Jonathan Crandall, Huxley, IA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 12/200,793

(22) Filed: Aug. 28, 2008

(51) Int. Cl.
*H03L 5/00* (2006.01)
(52) U.S. Cl. .......................... 327/333; 326/63; 326/81
(58) Field of Classification Search ............. 326/62–63, 326/80–81; 327/306, 333
See application file for complete search history.

(56) References Cited

U.S. PATENT DOCUMENTS

| | | | |
|---|---|---|---|
| 6,292,031 B1 | 9/2001 | Thompson et al. | |
| 6,380,777 B1 * | 4/2002 | Degardin et al. ............. | 327/170 |
| 6,417,708 B1 * | 7/2002 | Fiedler ........................ | 327/170 |
| 6,734,704 B1 | 5/2004 | Burkland | |
| 6,762,624 B2 | 7/2004 | Lai | |
| 6,771,126 B2 * | 8/2004 | Blankenship et al. ....... | 330/257 |
| 7,298,173 B1 | 11/2007 | Jiang et al. | |

* cited by examiner

*Primary Examiner*—Dinh T. Le
(74) *Attorney, Agent, or Firm*—Bever, Hoffman & Harms, LLP; Patrick T. Bever (57) ABSTRACT

A level shifter circuit includes two parallel current paths respectively controlled by switch transistors, a Wilson current mirror circuit, and a slew rate control circuit to selectively couple an output node either to a high (first) voltage source or to a ground (second voltage) source in response to differential input control signals signal. When the output node reaches a stable (high or low) voltage level, the low voltage on one of the current paths turns off a Wilson current mirror transistor in the other current path, thereby preventing quiescent current during stable periods. An optional cascode transistor is added to facilitate fabrication using low threshold voltage transistors.

13 Claims, 6 Drawing Sheets

SLEW RATE CONTROLLED LEVEL SHIFTER WITH REDUCED QUIESCENT CURRENT

FIELD OF THE INVENTION

This invention relates to electronic systems that utilize level shifter circuits, and more particularly to slew rate controlled level shifters for use in such electronic systems.

BACKGROUND OF THE INVENTION

Figure 8:
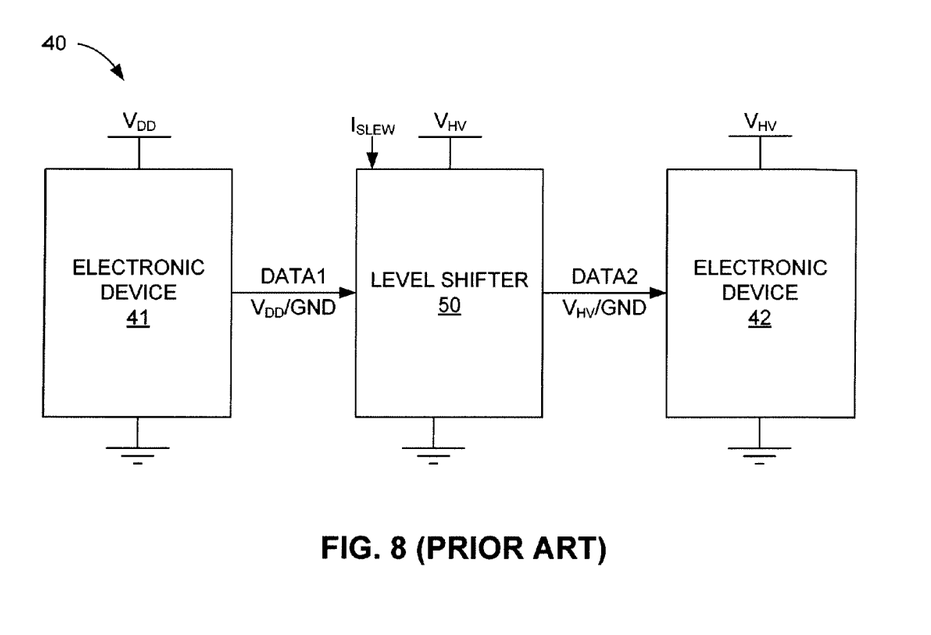
FIG. 8 is a simplified diagram showing a conventional system including a level shifter.

FIG. 8 is a simplified block diagram showing a portion of an electronic system 40 including two electronic devices 41 and 42 that operate using different operating voltages $V_{DD}$ and $V_{HV}$, where $V_{HV}$ is higher (or lower) than $V_{DD}$. Due to the different operating voltages, first electronic device 41 generates data signals having a voltage swing between GND and $V_{DD}$ (e.g., logic "1" data values are represented by 1V signal levels, and logic "0" data values are represented by 0V signal levels), whereas second electronic device 42 generates data signals having a voltage swing between GND and $V_{HV}$ (e.g., logic "1" data values are represented by 2.5V signal levels, and logic "0" data values are represented by 0V signal levels). Those skilled in the art recognize that data signals generated by device 41 typically cannot be utilized by device 42, and vice versa, due to the different voltages representing logic "1" data values.

In general, voltage level shifters are electronic circuits that facilitate communication between two electronic devices by converting "input" signals generated at the operating voltage of the first device to "output" signals that match the operating voltage of the second device. By way of example, as indicated in FIG. 8, a level shifter 50 is included in system 40 between devices 41 and 42, receives "input" data signals (DATA1) from device 41 having $V_{DD}$/0V voltage levels, and generates "output" data signals (DATA2) having $V_{HV}$ and 0V signal levels, thereby facilitating the transfer of data signals from device 41 to device 42. More specifically, an "input" data signal DATA1 having the digital (binary) value 1010 is represented by a series of voltage signals respectively having the signal levels $V_{DD}$, 0V, $V_{DD}$ and 0V, respectively. Level shifter 50 converts this "input" data signal to an "output" data signal DATA2 having the same digital (binary) value 1010, but having the voltage levels $V_{HV}$, 0V, $V_{HV}$ and 0V, respectively, and transmits this "output" data signal to device 42. In this way, the "input" data signals generated by device 41 is converted to form "output" signals whose voltage levels match the operating voltage device 42.

In addition to converting "input" signals to match the operating voltage of the second device, level shifters often include slew rate control circuitry that allows selective control of the "output" data signal slew rate. Referring again to FIG. 8, according to one approach, level shifter 50 receives a slew rate control current T and includes circuitry (not shown) that adjusts the slew rate of "output" data signal DATA2 (i.e., the rate at which the output voltage level changes between $V_{HV}$ and 0V during the generation of a binary signal) in accordance with the magnitude of control current $I_{SLEW}$. Such slew rate controlled level shifters further facilitate the transfer of data between two devices by facilitating, through the adjustment of control current $I_{SLEW}$, the transmission of the "output" data signals at a slew rate that is supported by the downstream (second) device (e.g., device 42 in FIG. 8).

It has become increasingly desirable to provide electronic systems and devices that exhibit reduced power consumption in order to maximize battery life in portable applications. A problem with conventional slew rate controlled level shifters is that they exhibit quiescent current (leakage) after the "output" signal is held stable at a selected voltage level (i.e., 0V or $V_{HV}$), thereby undesirably reducing battery life.

What is needed is a slew rate controlled level shifter that minimizes quiescent current after the "output" signal has reached a selected voltage level (i.e., 0V or $V_{HV}$), thereby undesirably reducing battery life.

SUMMARY OF THE INVENTION

The present invention is directed to a level shifter that minimizes or eliminates quiescent current by turning off its current paths between the high and low system voltage sources after the "output" signal has completed each high-to-low ($V_{HV}$ to 0V) or low-to-high (0V to $V_{HV}$) transition, thereby facilitating increasing battery life in portable devices by preventing quiescent current during periods when the "output" signal is held stable at a selected voltage level (i.e., either 0V or $V_{HV}$).

In accordance with an embodiment of the present invention, a level shifter circuit includes first and second parallel current paths that are respectively controlled by first and second switch transistors, a Wilson current mirror circuit, and a slew rate control circuit to selectively couple an output node either to a high (first) voltage source or to a ground (second voltage) source in response to an input data signal. The first current path includes a first current mirror transistor coupled between a high voltage source and a first node, the first switch transistor coupled between the first node and a second node, and a first slew rate control transistor coupled between the second node and the ground source. The second current path includes a second current mirror transistor coupled between the high voltage source and a third node, a third current mirror transistor coupled between the third node and the output node, the second switch transistor coupled between the output node and a fourth node, and a second slew rate control transistor coupled between the fourth node and the ground source. The slew rate control circuit includes a current mirror controlled by a slew rate control current to maintain the first and second slew rate control transistors in a partially turned on state. The Wilson current mirror is arranged such that the gate terminals of the first and second current mirror transistors are connected to the second node, and a gate terminal of the third current mirror transistor is connected to the first node.

During operation, input data signals transmitted from a first (low voltage) device are applied to the gate terminals of the first and second switch transistors as differential control signals such that, when the control signal applied to the gate terminal of the first switch transistor is high, the control signal applied to the gate terminal of the second switch transistor is low, and when the control signal applied to the gate terminal of the first switch transistor is low, the control signal applied to the gate terminal of the second switch transistor is high. Thus, in response to a logic "1" data signal, the first switch transistor is turned on and the second switch transistor is turned off, thereby discharging the first node to ground through the first slew rate control transistor at a transition rate determined by the slew rate control current, and preventing current flow from the output node to ground through the second slew rate control transistor. When the voltage level on first node drops to 0V, the low voltage turns on second and third current mirror transistors, thereby opening a signal path between the output node and the high voltage source, thereby charging the output node to the high voltage level required by the second device, and at a slew rate optimized for the second device. In accordance with an aspect of the present invention, when the output node reaches the high voltage level, the third node between the second and third current mirror transistors also reaches the high voltage level, thereby turning off the first current mirror transistor, which prevents further current flow between the high voltage source and ground so long as the input signal remains logic "1". In response to a subsequently logic "0" data signal generated by the first device, the signal path through the second and third current mirror transistors to the output node is turned off, and a signal path from the output node to ground is opened that passes through the second slew rate control transistor, thereby discharging the output node at the optimized slew rate. As such, in accordance with the present invention, in each stable output state of the slew rate controlled level shifter circuit, quiescent current is prevented from flowing through the first and second current paths between the high voltage source $V_{HV}$ and ground by the Wilson current mirror, thereby minimizing power consumption.

In accordance with an alternative embodiment of the present invention, a cascode transistor is coupled between the first current mirror transistor and the first node in the first current path, and a third current path is provided to control the cascode transistor such that the drain to source voltage across the first current mirror transistor is limited. By limiting the drain to source voltage on first current mirror transistor, low voltage transistors can be used to form the Wilson current mirror, and the voltage at the output node will transition close to the high voltage source level before the current mirror transistors start to turn off. The third current path includes transistors arranged to bias the cascode transistor. While some current is drawn from the high voltage source through the third current path, this current can be made acceptably small by sizing the transistors properly.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in slew rate controlled level shifters. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
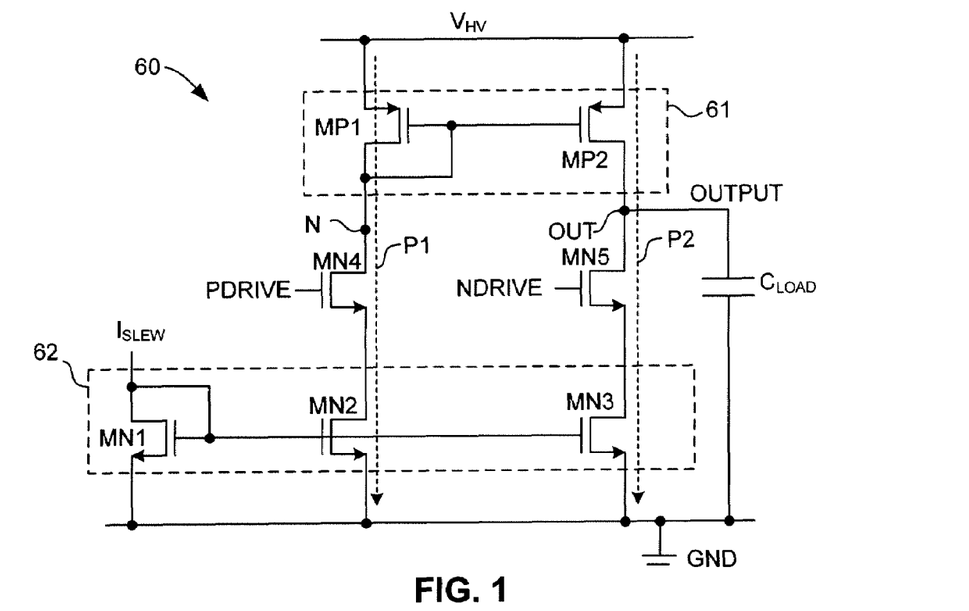
FIG. 1 is a circuit diagram showing an exemplary slew rate controlled level shifter.

FIG. 1 shows a generalized slew rate controlled level shifter 60 receives "input" data signals in the form of differential control signals NDRIVE and PDRIVE from a first device (not shown), and generates corresponding "output" data signals (OUTPUT) on an output node OUT, which is connected to a second device represented by capacitive load $C_{LOAD}$.

Level shifter 60 includes first and second switch transistors MN4 and MN5, a current mirror circuit 61 including first and second current mirror transistors MP1 and MP2, and a slew rate control circuit 62 including slew rate control transistors MN1, MN2 and MN3. Current mirror 61 is formed by connecting the gate terminals of current mirror transistors MP1 and MP2 to a node N, which is coupled to a high (first) voltage source $V_{HV}$ by way of current mirror transistor MP1. Slew rate control circuit 62 receives a slew rate control current $I_{SLEW}$, and generates a corresponding current in slew rate control transistor MN1, which is mirrored in slew rate control transistors MN2 and MN3 according to known techniques. Slew rate control current $I_{SLEW}$ can be generated, for example, by a user adjustable reference circuit (not shown) included in or disposed adjacent to level shifter 60, and is set by a user such that the output data signal is generated at a slew rate determined by the second device.

Level shifter 60 may be functionally divided into first and second parallel current paths P1 and P2 that are controlled by control signals NDRIVE and PDRIVE to selectively couple output node OUT either to high voltage source V, or to ground (second voltage source) GND, where high voltage source $V_{HV}$ is greater than the logic "1" voltage level ($V_{DD}$) of control signals NDRIVE and PDRIVE. Signal path P1 includes, in series, current mirror transistor MP1, first switch transistor MN4, and slew rate control transistor MN2. Signal path P2 includes, in series, current mirror transistor MP2, which is connected between high voltage source $V_{HV}$ and output node OUT, second switch transistor MN5, and slew rate control transistor MN3.

During operation, level shifter circuit 60 generates output signal OUTPUT in response to control signals PDRIVE and NDRIVE as follows. Slew rate control current $I_{SLEW}$ generates a current through transistor MN1 that is proportional to the applied current magnitude, and causes a proportional current to flow in slew rate control transistors MN2 and MN3. When data signal NDRIVE is at ground (0V), switch transistor MN5 is off, and current through switch transistor MN3 cannot discharge output node OUT. However, when data signal NDRIVE is at $V_{DD}$, switch transistor MN5 is on, and current through slew rate control transistor MN3 flows through switch transistor MN5, thereby discharging the capacitive load on node OUT with a controlled slew rate determined by the magnitude of the current flowing in slew rate control transistor MN3, which is proportional to slew rate control current $I_{SLEW}$. When data signal PDRIVE is at ground, switch transistor MN4 is off, and current through slew rate control transistor MN2 cannot flow to current mirror transistor MP1. However, when control signal PDRIVE is at $V_{DD}$, switch transistor MN4 is on and the current through transistor MN2 flows through transistor MN4 and to transistor MP1.

Current mirror 61 includes transistors MP1 and MP2, which are connected between high voltage source $V_H$, and transistors MN4 and MN5, respectively. The current flowing in transistor MP1 causes a proportional current to flow in transistor MP2, which charges the capacitive load on node OUT with a controlled slew rate determined by the magnitude of the current flowing in current mirror transistor MP2, which in turn is proportional to the current flowing through slew rate control transistor MN2 and, consequentially, slew rate control current $I_{SLEW}$.

A problem with slew rate controlled level shifter 60 is that when data signal PDRIVE is switched to $V_{DD}$, current flows through transistors current path P1 (i.e., through current mirror transistor MP1, switch transistor MN4 and slew rate control transistor MN2) even after node OUT has transitioned fully to V. The result is undesired current consumption from the $V_{HV}$ power supply. It would be desirable that current consumption was zero, or at least minimized, once the OUTPUT transition is complete.

Figure 2:
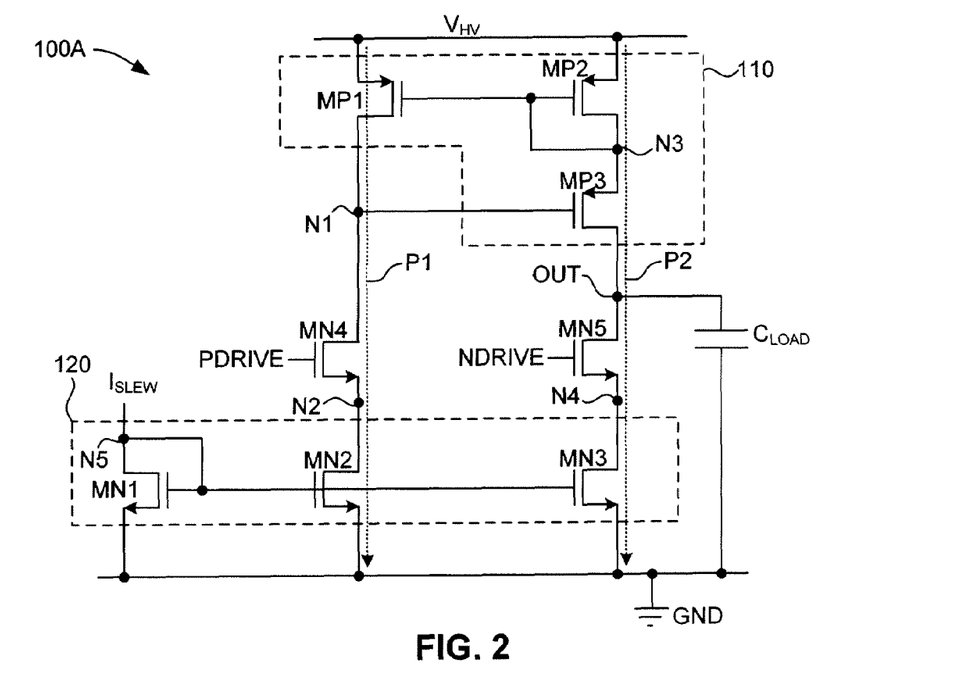
FIG. 2 is a circuit diagram showing an exemplary slew rate controlled level shifter according to a first embodiment of the present invention.

FIG. 2 is a circuit diagram illustrating a slew rate controlled level shifter 100A according to an embodiment of the present invention. Similar to level shifter 60, level shifter 100A includes first and second parallel current paths P1 and P2 that are respectively controlled by first and second switch transistors MN4 and MN5 and a slew rate control circuit 120 to selectively couple an output node OUT either to a high (first) voltage source $V_{HV}$ or to ground (second voltage source) GND in response to an input data signal NDRIVE and PDRIVE, and to transition between the two output voltage levels at a rate determined by a user supplied slew rate control current $I_{SLEW}$. However, as described in detail below, level shifter 100A differs from level shifter 60 in that level shifter 100A addresses the shortcomings set forth above by replacing current mirror 61 with a Wilson current mirror 110, formed by current mirror transistors MP1, MP2 and MP3, that shut off current flow between $V_{HV}$ and ground (i.e., through current paths P1 and P2) after the transition of output signal OUTPUT is complete.

As indicated in FIG. 2, current paths P1 and P2 include an NMOS switch transistor, an NMOS slew rate control transistor, and at least one PMOS current mirror transistor. In particular, (first) discharge path P1 includes, in series, (first) current mirror transistor MP1 coupled between high voltage source $V_{HV}$ and a first node N1, (first) switch transistor MN4 coupled between the first node N1 and a second node N2, and (first) slew rate control transistor MN2 coupled between the second node and the ground source GND. Second discharge path P2 includes (second) current mirror transistor MP2 coupled between high voltage source $V_{HV}$ and a third node N3, (third) current mirror transistor MP3 coupled between the third node N3 and the output node OUT, (second) switch transistor MN5 coupled between the output node OUT and a fourth node N4, and (second) slew rate control transistor MN3 coupled between the fourth node N4 and the ground source GND.

Slew rate control circuit 120 functions as described above to apply the same gate voltage to both slew rate control transistors MN2 and MN3. A (third) slew rate control transistor MN1 of slew rate control circuit 120 is connected between (second voltage) ground source GND and a (fifth) node N5, which serves as a source of slew rate control current $I_{SLEW}$. By increasing or decreasing the magnitude of slew rate control current $I_{SLEW}$ using known techniques, a user is able to increase/decrease the gate voltage applied to slew rate control transistors MN2 and MN3, thereby controlling the slew rate at output node OUT.

Referring to the upper portion of FIG. 2, Wilson current mirror 110 minimizes undesired current consumption by connecting PMOS current mirror transistors MP1, MP2, and MP3 in a way that prevents current flow when voltage levels at output node OUT are stabilized. In particular, the gate terminals of current mirror transistors MP1 and MP2 are connected to node N3, and the gate terminal of current mirror transistor MP3 is connected to node N1. During operation, when data signal PDRIVE is at ground (0V), switch transistor MN4 is off, and current in path P1 between slew rate control transistor MN2 and current mirror transistor MP1 is prevented. However, when data signal PDRIVE is at $V_{DD}$, transistor MN4 is on, and the current from transistor MN2 flows through transistor MN4, pulling the gate of transistor MP3 toward ground, and turning transistor MP3 on. As transistor MP3 turns on, current flows through transistors MP2 and MP3, thereby charging output node OUT to $V_{HV}$, and also a current flows in transistor MP1 that is proportional to the current flowing through transistor MP2. When the current flowing in transistor MP1 equals the current flowing in transistor MN4, the voltage at the gate of transistor MP3 reaches a value such that the current flowing in transistors MP2 and MP3 is proportional to the current flowing in transistors MP1 and MN2, and therefore is established by slew rate control current $I_{SLEW}$. Because the current in transistor MP2 is the current that charges the capacitive load attached to output node OUT during its transition from ground to $V_{HV}$, the slew rate is again controlled by slew rate control current $I_{SLEW}$. However, once node OUT has completed the transition to $V_{HV}$, transistor MP2 turns off as its gate-to-source voltage drops to ground (0V). Because the current in transistor MP1 is proportional to the current in transistor MP2, transistor MP1 also turns off, stopping further current from flowing from the $V_{HV}$ supply through transistors MP1, MN4 and MN2 once node OUT has completed its transition to $V_{HV}$.

When level shifter 100A is utilized in an integrated circuit, transistors MP1 and MP3 must be fabricated in a way that is capable of withstanding the $V_{HV}$ supply voltage across their drain to source, and further transistor MP3 must be able to withstand supply voltage $V_{HV}$ across its gate to source. This requirement may not be a problem depending on the value of supply voltage $V_{HV}$ and the available devices for the given process technology. In such cases, level shifter 100A (FIG. 2) is the preferred embodiment of the invention. However, some process technologies may have limitations that give rise to problems for higher $V_{HV}$ supply voltages. In particular, to withstand higher gate to source voltages, a thick gate oxide is generally required, but this typically results in a high threshold voltage for the transistor. For example, if the $V_{HV}$ supply is 100V, the field oxide may be used as the gate oxide to enable the transistor to withstand 100V across its gate to source. However, such a transistor may have a threshold voltage of approximately 10V, rather than the approximately 1V threshold of a typical low transistor. If such a higher threshold voltage transistor is used for transistor MP2, undesirable performance may result. It is desirable that transistor MP2 not turn off until output signal OUTPUT is fully transitioned to $V_{HV}$ because the slew rate will deviate from the desired value once transistor MP2 starts to turn off. But a higher threshold voltage results in transistor MP2 turning off at a lower OUTPUT voltage than desirable. One solution is to use a thick gate oxide transistor, with higher threshold, for transistor MP3, and thin oxide transistors, with lower thresholds, for transistors MP1 and MP2. (Note that transistors MP1 and MP2 must be matching devices for Wilson current mirror 110 to perform accurately.) This is possible if the devices available include both thin and thick gate oxide transistors that are able to withstand the $V_{HV}$ supply voltage across their drain to source. However, if suitable low threshold transistors with the ability to withstand $V_{HV}$ across their drain to source are not available, then the level shifter circuit of FIG. 3 (described below) may be used.

Figure 3:
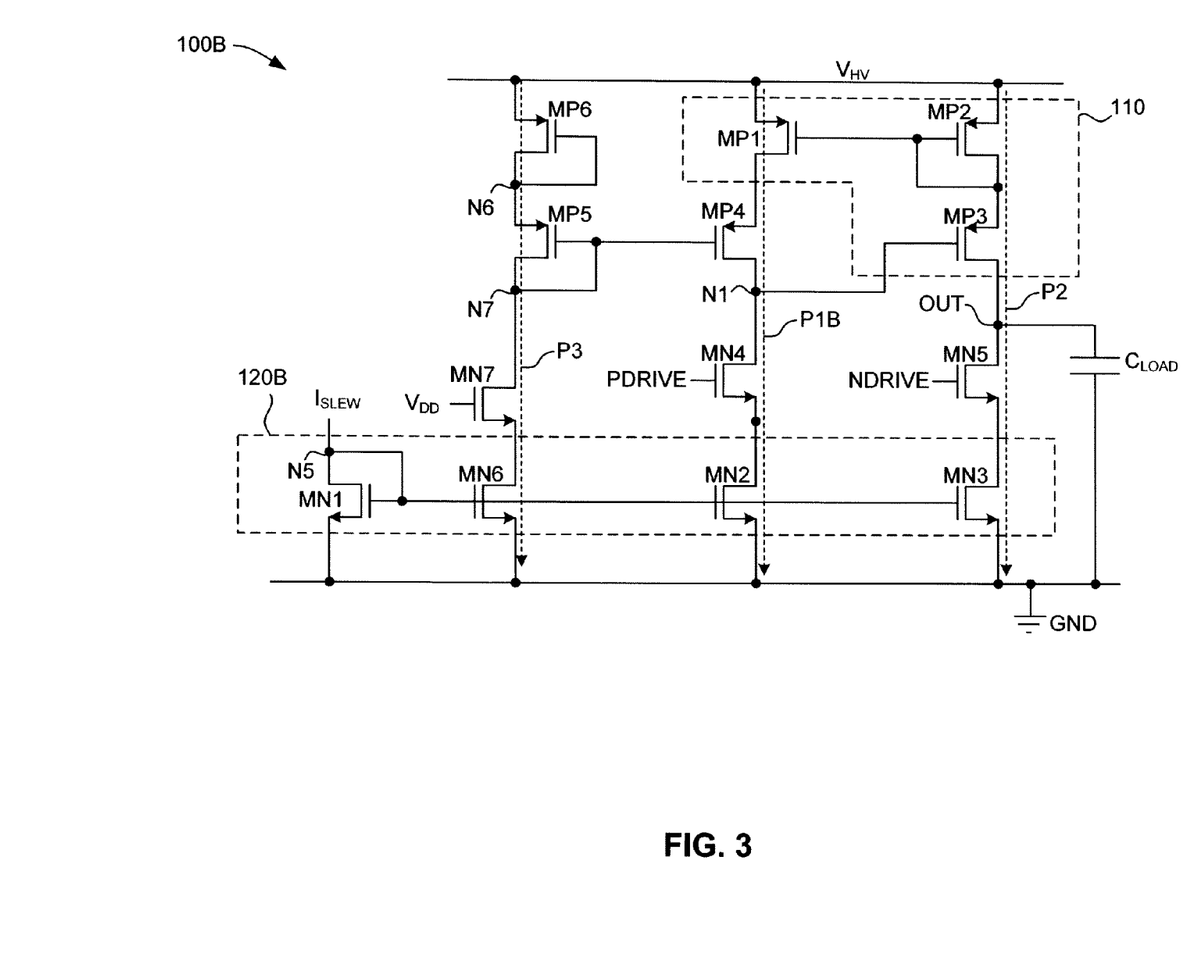
FIG. 3 is circuit diagram showing a slew rate controlled level shifter according to another embodiment of the present invention.

FIG. 3 is a circuit diagram showing a slew rate controlled level shifter circuit 100B according to an alternative embodiment of the present invention. Level shifter 100B includes switch transistors MN4 and MN5, Wilson current mirror 110 and a slew rate control circuit 120B that are substantially identical to and function similar to circuits having the same or similar reference numbers described above with reference to level shifter 100A, and description of these circuit elements is omitted below for brevity. Level shifter 100B mainly differs from level shifter 100A in that a PMOS cascode transistor MP4 is coupled between current mirror transistor MP1 and node N1 in current path P1B in order to limit the drain to source voltage across current mirror transistor MP1. By limiting the drain to source voltage on current mirror transistor MP1, cascode transistor MP4 facilitates the production of level shifter 100B using low voltage PMOS transistors for current mirror transistors MP1 and MP2, and the voltage at output node OUT will transition close to high voltage $V_{HV}$ before current mirror transistors MP2 and MP1 start to turn off.

In the disclosed embodiment, the gate terminal of cascode transistor MP4 is controlled by a bias circuit made up of PMOS transistors MP5 and MP6 and NMOS transistors MN6 and MN7, which are connected in series to form a third current path P3, and serve to bias the cascode transistor MP4 such that the desired voltage drop is maintained across current mirror transistor MP1. PMOS transistors MP6 is connected between high voltage source $V_{HV}$ and a sixth node N6, PMOS transistor MP5 is connected between node N6 and a seventh node N7, and NMOS transistors MN7 and MN6 are respectively connected in series between node N7 and ground. The gate terminal of transistor MP6 is connected to node 6, and the gate terminals of transistor MP5 and cascode transistor MP4 are connected to node 7. The gate terminal of transistor MN7 is connected to the (fixed voltage) operating voltage source $V_{DD}$ of the first device (not shown; i.e., the source of control signals PDRIVE and NDRIVE), and transistor MN6 is included in slew rate control circuit 120B (i.e., the gate terminal of transistor MN6 is connected to node N5). Although this arrangement produces some current flow from the $V_{HV}$ through this bias circuit (i.e., along path P3), this quiescent current can be made acceptably small by properly sizing transistor MP5, MP6, MN6 and MN7 according to known techniques.

Figure 4:
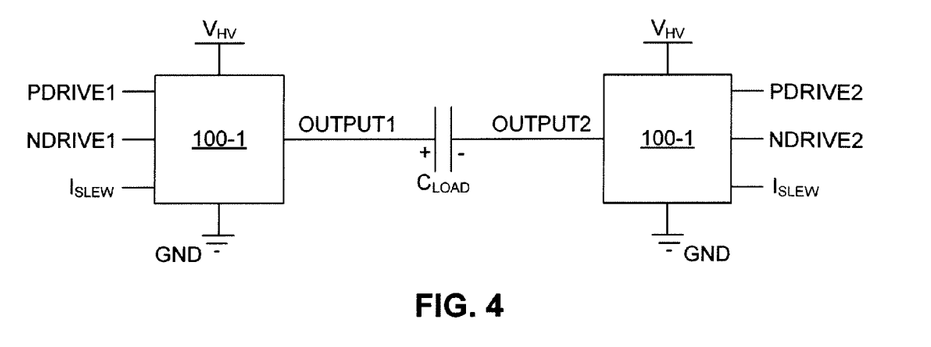
FIG. 4 is a simplified diagram showing a system including two slew rate controlled level shifters according to another embodiment of the present invention.
Figure 5:
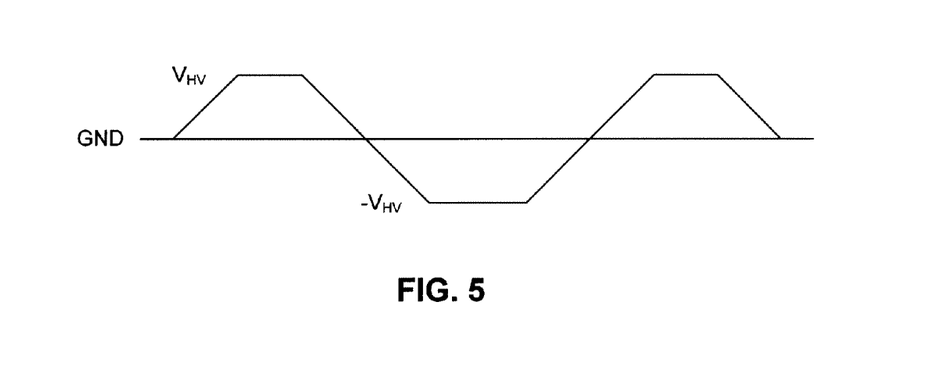
FIG. 5 is a timing diagram depicting the operation of the system of FIG. 4.

FIG. 4 is a simplified diagram showing a portion of a system including two level shifters 100-1 and 100-2 connected to apply output signals OUTPUT1 and OUTPUT2, respectively to opposite terminals of a capacitive load (second device) $C_{LOAD}$. Level shifters 100-1 and 100-2 are implemented using either of level shifter circuits 100A and 100B (see FIGS. 2 and 3). It is sometimes desired to connect level shifters to form the H-bridge arrangement shown in FIG. 4, wherein level shifter circuit 100-1 drives a positive (+) side of capacitive load $C_{LOAD}$, and level shifter circuit 100-2 drives the negative (−) side of capacitive load $C_{LOAD}$. During operation, when it is desired to place a positive voltage across the load, level shifter 100-1 is caused to transition OUTPUT1 in response to an applied input signal (as described above) while OUTPUT2 is held approximately at ground by level shifter 100-2. Conversely, when it is desired to place a negative voltage across the load, level shifter 100-2 is caused to transition OUTPUT2 in response to an applied input signal (as described above) while OUTPUT1 is held approximately at ground by level shifter 100-1.

Figure 6:
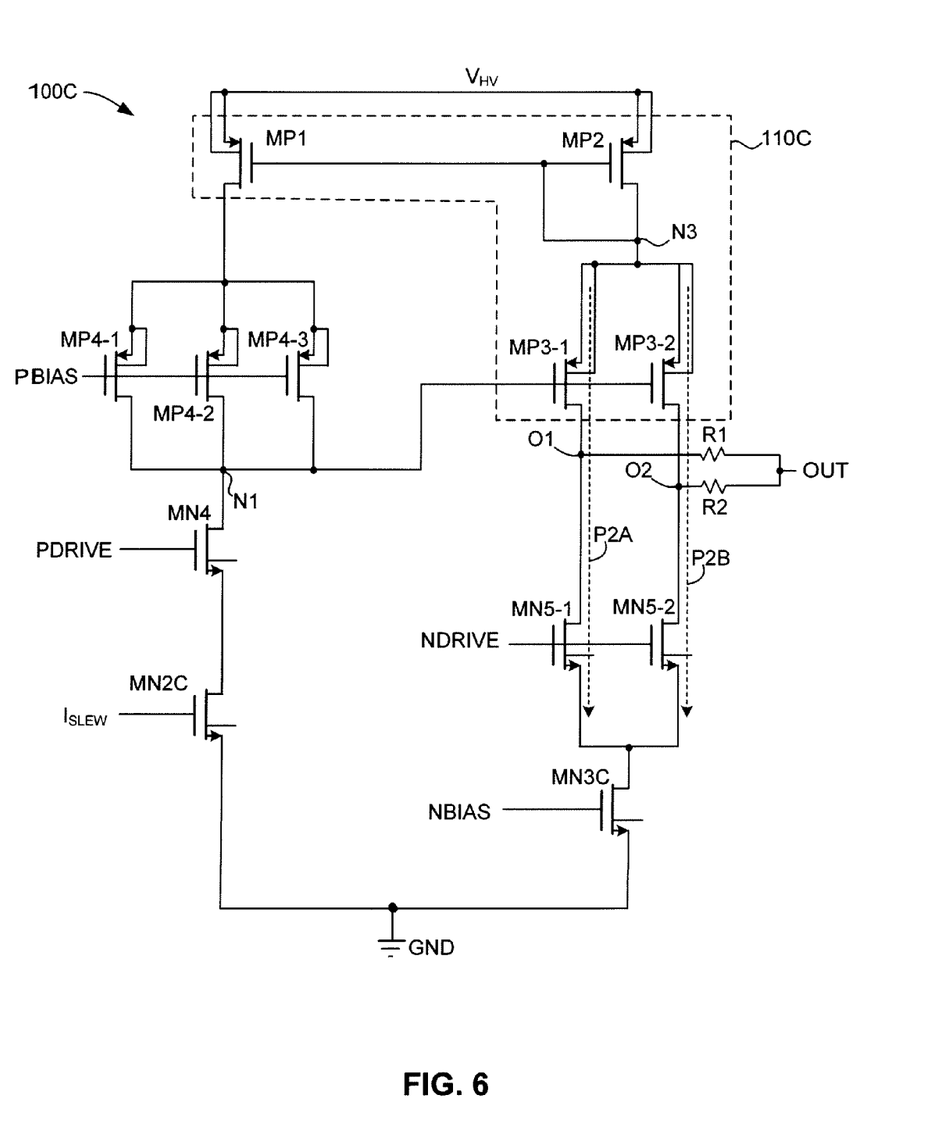
FIG. 6 is a circuit diagram showing a slew rate controlled level shifter according to another embodiment of the present invention.
Figure 7:
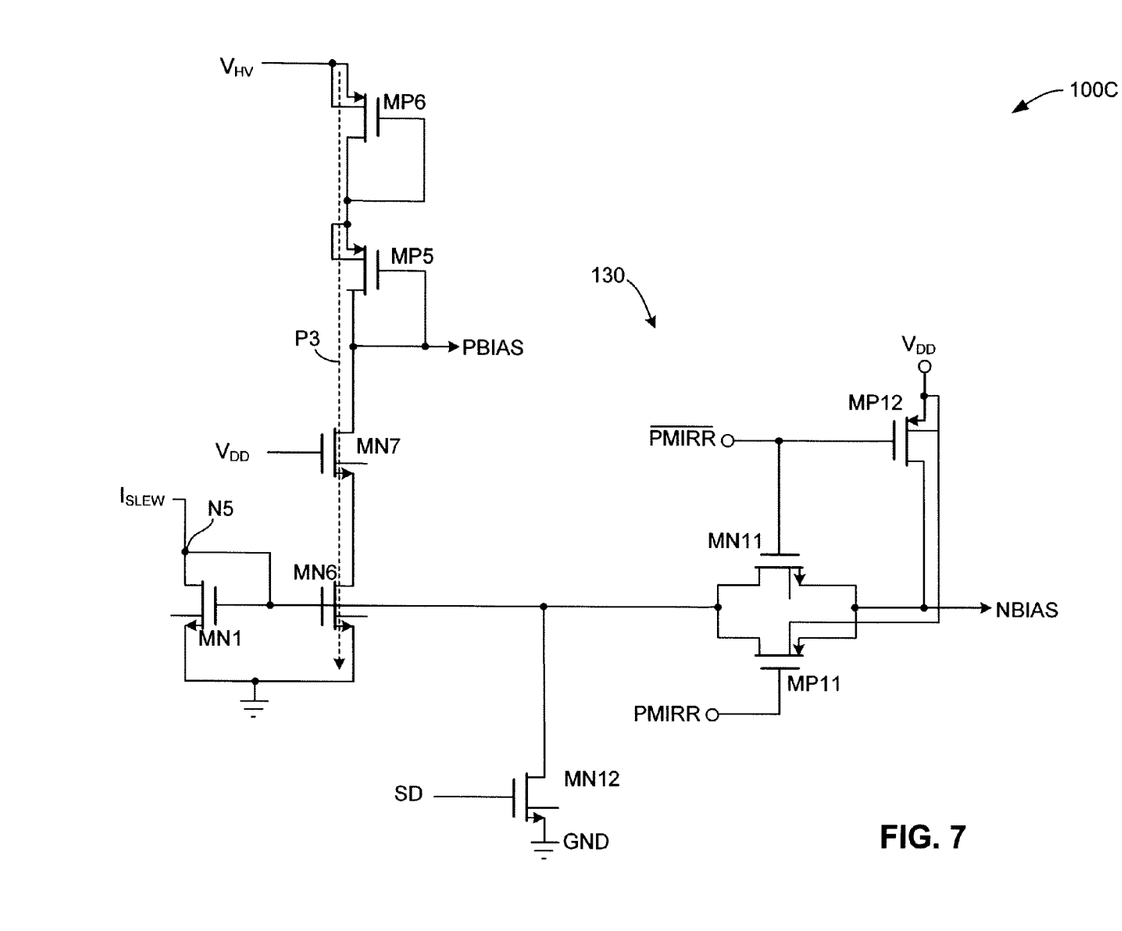
FIG. 7 is a circuit diagram showing a bias circuit associated with the slew rate controlled level shifter of FIG. 6.

FIGS. 6 and 7 are circuit diagrams showing a level shifter 100C according to another embodiment of the present invention. Level shifter 100C is similar to the level shifters described above, but differs in the manner described below. In the description below, circuit elements of level shifter 100C that perform substantially the same purpose as corresponding elements of level shifters 100A and 100E are identified with the same reference numbers for brevity.

Referring to the right side of FIG. 6, level shifter 100C is similar to level shifter 100B (FIG. 3) in that both level shifters includes a Wilson current mirror formed by PMOS transistors MP1 and MP2 coupled to a node N3. However, level shifter 100C differs from level shifter 100B in that the signal path P2 is divided below node N3 into parallel signal paths P2A and P2B. Parallel path P2A includes PMOS (current mirror) transistor MP3-1 connected between node N3 and a node O1, and an NMOS (switch) transistor MN5-1 connected between node O1 and slew rate transistor MN3C. Parallel path P2B includes PMOS (current mirror) transistor MP3-2 connected between node N3 and a node O2, and an NMOS (switch) transistor MN5-2 connected between node O2 and slew rate transistor MN3C. Nodes O1 and O2 are connected to output node OUT by way of resistor R1 and R2. Separating this current path into parallel paths P2A and P2B provides the benefit of mitigating the risk of ESD damage through ballasting—providing multiple conductive paths through which the current can flow, in order to reduce the stress on any one particular device. ESD protection is also the reason for resistors R1 and R2. Level shifter 100C also includes a segmented version of cascode transistor MP4 of level shifter 100B (see FIG. 3), consisting of cascode transistors MP4-1, MP4-2 and MP4-3. Segmenting a transistor in this way allows for flexibility to change the width of the transistor while incurring minimal cost additional cost.

FIG. 7 is a circuit diagram showing a portion of level shifter 100C including current path P3 (i.e., the source of bias signal PBIAS, which is applied to the gate terminal of cascode transistor MP4; see FIG. 6). FIG. 7 also shows a bias circuit 130, which represents a further modification incorporated by level shifter 100C that is provided to support the operation of the H-bridge arrangement described above with reference to FIG. 4. In particular, bias circuit 130 includes transmission gate transistors MP11 and MN11 and pull-up device MP12 that generate a bias signal NBIAS that is supplied to slew rate control transistor MN3C (see FIG. 6) in accordance with control signals PMIRR and PMIRR-bar, which are opposite polarity logic signals that is externally generated. In a first operating state (i.e., control signal PMIRR is low and control signal PMIRR-bar is high), transmission gate transistors MP11 and MN11 pass slew rate control current $I_{SLEW}$ to the gate terminal of slew rate control transistor MN3C (see FIG. 6), thereby facilitating the operation described above with reference level shifters 100A and 100B. In a first operating state (i.e., control signal PMIRR is high and control signal PMIRR-bar is low), transmission gate transistors MP11 and MN11 are turned off, and pull-up transistor MP12 is turned on to apply supply voltage $V_{DD}$ to the gate terminal of slew rate control transistor MN3C (see FIG. 6). By allowing selective application of supply voltage $V_{DD}$ to the gate terminal of slew rate control transistor MN3C, bias circuit 130 enables this transistor to be "fully" turned on during a corresponding portion of the H-bridge, providing a lower impedance path to ground. This is useful in H-bridge applications in which the OUT node needs to sink more current and still maintain a 0V or GND potential (e.g. transients) during certain periods of the H-bridge cycle. Note that NMOS transistor MN12 is controlled by an externally generated "shutdown" signal SD to ensure that the levels shifter turns off properly.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A slew rate controlled level shifter circuit for selectively passing a first voltage level from a first voltage source to an output node when an input data signal has a first value, for selectively passing a second voltage level from a second voltage source to the output node when the input data signal has a second value, wherein the level shifter circuit comprises:
   a first current path including a first current mirror transistor coupled between the first voltage source and a first node, a first switch transistor coupled between the first node and a second node, and a first slew rate control transistor coupled between the second node and the second voltage source;
   a second current path including a second current mirror transistor coupled between the first voltage source and a third node, a third current mirror transistor coupled between the third node and the output node, a second switch transistor coupled between the output node and a fourth node, and a second slew rate control transistor coupled between the fourth node and the second voltage source,
   wherein gate terminals of the first and second slew rate control transistors are coupled to a fifth node,
   wherein gate terminals of the first and second current mirror transistors are connected to the third node, and a gate terminal of the third current mirror transistor is connected to the first node, and
   wherein gate terminals of the first and second switch transistors respectively receive differential control signals.

2. The slew rate controlled level shifter circuit according to claim 1, further comprising a third slew rate control transistor coupled between the fifth node and the second voltage source, wherein a gate terminal of the third slew rate control transistor is coupled to the fifth node such that a gate voltage applied to each of the first, second and third slew rate control transistors is determined by a slew rate control current applied to said fifth node.

3. The slew rate controlled level shifter circuit according to claim 1,
   wherein the first, second and third current mirror transistors comprise PMOS transistors, and
   wherein the first and second switch transistors and the first and second slew rate control transistors comprise NMOS transistors.

4. The slew rate controlled level shifter circuit according to claim 1, further comprising:
   a cascode transistor connected between the first current mirror transistor and the first node.

5. The slew rate controlled level shifter circuit according to claim 4, further comprising:
   a first PMOS transistor connected between the first voltage source and a sixth node;
   a second PMOS transistor connected between the sixth node and a seventh node; and
   first and second NMOS transistors connected in series between the seventh node and the second voltage source,
   wherein the gate terminal of the first PMOS transistor is connected to the sixth node,
   wherein the gate terminals of the second PMOS transistor and the cascode transistor are connected to the seventh node,
   wherein the gate terminal of the second NMOS transistor is connected to the fifth node, and
   wherein the gate terminal of the first NMOS transistor is connected to a fixed voltage source.

6. The slew rate controlled level shifter circuit according to claim 1, further comprising:
   a third slew rate control transistor coupled between the fifth node and the second voltage source, wherein a gate terminal of the third slew rate control transistor is coupled to the fifth node.

7. A slew rate controlled level shifter circuit for selectively generating a first voltage level on an output node when an input data signal has a first value, for selectively generating a second voltage level on the output node when the input data signal has a second value, and for controlling transitions between the first and second voltage levels in accordance with a selected slew rate determined by a slew rate current source, wherein the level shifter circuit comprises:
   a first current path including a first switch transistor and a first slew rate control transistor connected in series between a first node and the second voltage source, wherein the first switch transistor is controlled by the input data signal such that the first switch transistor is opened when the input data signal has the first value, and is closed when the input data signal has the second value; and
   a second current path including a second switch transistor and a second slew rate control transistor connected in series between the output node and the second voltage source, wherein the second switch transistor is controlled by the input data signal such that the second switch transistor is opened when the input data signal has the second value, and is closed when the input data signal has the first value; and
   a Wilson current mirror circuit connected coupled between a first voltage source and the first node and the output node.

8. The slew rate controlled level shifter circuit according to claim 7, wherein the Wilson current mirror comprises:
   a first current mirror transistor coupled in the first current path between the first voltage source and the first node,
   second current mirror transistor coupled in the second current path between the first voltage source and a second node, and
   a third current mirror transistor coupled in the second current path between the third node and the output node,
   wherein gate terminals of the first and second current mirror transistors are connected to the second node, and a gate terminal of the third current mirror transistor is connected to the first node.

9. The slew rate controlled level shifter circuit according to claim 8, further comprising a third slew rate control transistor coupled between a third node the second voltage source, wherein a gate terminal of the third slew rate control transistor is coupled to the third node such that a gate voltage applied to each of the first, second and third slew rate control transistors is determined by a slew rate control current applied to said third node.

10. The slew rate controlled level shifter circuit according to claim 8,
wherein the first, second and third current mirror transistors comprise PMOS transistors, and
wherein the first and second switch transistors and the first and second slew rate control transistors comprise NMOS transistors.

11. The slew rate controlled level shifter circuit according to claim 8, further comprising:
a cascode transistor connected between the first current mirror transistor and the first node.

12. The slew rate controlled level shifter circuit according to claim 11, further comprising:
a first PMOS transistor connected between the first voltage source and a fourth node;
a second PMOS transistor connected between the fourth node and a fifth node; and
first and second NMOS transistors connected in series between the seventh node and the second voltage source,
wherein the gate terminal of the first PMOS transistor is connected to the fourth node,
wherein the gate terminals of the second PMOS transistor and the cascode transistor are connected to the fifth node,
wherein the gate terminal of the second NMOS transistor is connected to the third node, and
wherein the gate terminal of the first NMOS transistor is connected to a fixed voltage source.

13. A level shifter circuit for selectively coupling, in response to a data signal, an output node to a first voltage level provided by a first voltage source and a second voltage level provided by a second voltage source such that transitions between the first and second voltage levels are controlled in response to a selected slew rate determined by a slew current source, the level shifter circuit comprising:
a first current mirror including a first current mirror transistor connected between the first voltage source and a first node, a second current mirror transistor connected between the first voltage source and a third node, and a third current mirror transistor connected between the third node and the output node, wherein gate terminals of the first and second current mirror transistors are connected to the third node, and a gate terminal of the third current mirror transistor is connected to the first node;
a slew rate control circuit including a first slew rate control transistor connected between the second voltage source and a second node, a second slew rate control transistor connected between the second voltage source and a fourth node, and a third slew rate transistor connected between the second voltage source and a fifth node wherein gate terminals of the first, second and third slew rate control transistors are coupled to the fifth node, and wherein the fifth node is coupled to the slew current source;
a first switch transistor connected between the first node and the second node; and
a second switch transistor connected between the fourth node and the output node;
wherein the at least one data signal is applied to the gate terminals of the first and second switch transistors.

* * * * *

UNITED STATES PATENT AND TRADEMARK OFFICE
CERTIFICATE OF CORRECTION

PATENT NO. : 7,679,420 B1  Page 1 of 1
APPLICATION NO. : 12/200793
DATED : March 16, 2010
INVENTOR(S) : William Andrew Burkland et al.

It is certified that error appears in the above-identified patent and that said Letters Patent is hereby corrected as shown below:

On the title page, item (57) ABSTRACT, line 6, delete "signal".

Column 10, line 52, delete "connected".

Column 10, line 63, amend "third" to -- second --.

Column 11, line 3, insert -- and -- before "the".

Signed and Sealed this

Twentieth Day of April, 2010

David J. Kappos
*Director of the United States Patent and Trademark Office*